US011454650B2

(12) United States Patent
Yamazaki et al.

(10) Patent No.: US 11,454,650 B2
(45) Date of Patent: Sep. 27, 2022

(54) PROBE, INSPECTION JIG, INSPECTION DEVICE, AND METHOD FOR MANUFACTURING PROBE

(71) Applicant: NIDEC-READ CORPORATION, Kyoto (JP)

(72) Inventors: Hidekazu Yamazaki, Kyoto (JP); Yukio Kumamoto, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 0 days.

(21) Appl. No.: 17/043,770

(22) PCT Filed: May 27, 2019

(86) PCT No.: PCT/JP2019/020941
§ 371 (c)(1),
(2) Date: Sep. 30, 2020

(87) PCT Pub. No.: WO2020/017159
PCT Pub. Date: Jan. 23, 2020

(65) Prior Publication Data
US 2021/0132112 A1    May 6, 2021

(30) Foreign Application Priority Data
Jul. 18, 2018    (JP) .............................. JP2018-134857

(51) Int. Cl.
*G01R 1/067*    (2006.01)
(52) U.S. Cl.
CPC ....... *G01R 1/06738* (2013.01); *G01R 1/0675* (2013.01)

(58) Field of Classification Search
CPC .............. G01R 1/06738; G01R 1/0675; G01R 1/07342; G01R 1/06733; G01R 3/00; G01R 1/073; G01R 31/2886
See application file for complete search history.

(56) References Cited

U.S. PATENT DOCUMENTS 5,673,477 A * 10/1997 Hattori ............... G01R 1/07307
29/825
6,419,500 B1    7/2002 Kister
(Continued)

FOREIGN PATENT DOCUMENTS

| JP | 2001074779 A | * | 3/2001 | ......... G01R 1/07357 |
| JP | 2001074779 A | | 3/2001 | |
| JP | 2010197092 A | | 9/2010 | |

(Continued)

*Primary Examiner* — Lee E Rodak
(74) *Attorney, Agent, or Firm* — Viering, Jentschura & Partner mbB

(57) ABSTRACT

A probe has a substantially bar shape, and includes a tip end, a base end, and a body portion that is located between the tip end and the base end and has a thickness in a thickness direction orthogonal to an axial direction of the substantially bar shape thinner than the tip end. The body portion includes a slope surface that is continuous with the tip end and is inclined with respect to the axial direction in a direction in which the thickness becomes gradually thinner with increasing distance from the tip end. A first region having a surface shape that bulges outward is provided in at least a part of the slope surface.

18 Claims, 16 Drawing Sheets

(56) References Cited

U.S. PATENT DOCUMENTS

2010/0231249 A1  9/2010  Dang et al.
2012/0074979 A1* 3/2012  Lee .................... G01R 1/06716
                                                    324/755.01

FOREIGN PATENT DOCUMENTS

JP           2012242178 A    12/2012
JP           2015212622 A    11/2015

* cited by examiner

PROBE, INSPECTION JIG, INSPECTION DEVICE, AND METHOD FOR MANUFACTURING PROBE

CROSS-REFERENCE TO RELATED APPLICATIONS

This is the U.S. national stage of application No. PCT/JP2019/020941, filed on May 27, 2019, and priority under 35 U.S.C. § 119(a) and 35 U.S.C. § 365(b) is claimed from Japanese Patent Application No. 2018-134857, filed on Jul. 18, 2018; the disclosures of which are incorporated herein by reference.

FIELD

Various embodiments relate to a probe, an inspection jig, an inspection device, and a method for manufacturing a probe that are used in inspection.

BACKGROUND

In the related art, inspection of an inspection object, such as a semiconductor chip or a substrate on which circuits, wiring, and the like are formed, has been performed by causing a plurality of needle-like probes to abut on the inspection object and applying electrical signals between the probes, or detecting signals by the probes in order to inspect the inspection object. As such a probe, there is known a probe including a needle tip portion, a needle middle portion that follows the needle tip portion, and a needle rear portion that follows the needle middle portion, and the needle middle portion has a plate-like flat shape.

By the way, in the above-mentioned probe, when the probe is brought into contact with an inspection object, strain applied to the probe is likely to concentrate on the boundary between the needle tip portion and the needle middle portion.

SUMMARY

An exemplary probe according to the present disclosure has a substantially bar shape, and includes one end, the other end, and the body portion which is located between the one end and the other end and has a thickness in the thickness direction orthogonal to the axial direction of the substantially bar shape thinner than the one end. The body portion includes the first slope surface which is continuous with the one end and is inclined with respect to the axial direction in a direction where the thickness becomes gradually thinner with increasing distance from the one end. The first region having a surface shape bulging outward is provided in at least a part of the first slope surface.

Further, an exemplary inspection jig according to the present disclosure includes a plurality of probes described above and a support member that supports the plurality of probes.

In addition, an exemplary inspection device according to the present disclosure inspects the inspection object by bring the probe into contact with the inspection object.

In addition, in an exemplary method for manufacturing the probe according to the present disclosure, a first mold and a second mold that face each other in the thickness direction, correspond to a shape of the body portion, and have recesses corresponding to the first region are used, and press working is performed on a bar-like member that is interposed between the first mold and the second mold.

The above and other elements, features, steps, characteristics and advantages of the present disclosure will become more apparent from the following detailed description of the preferred embodiments with reference to the attached drawings.

DETAILED DESCRIPTION

Figure 1:
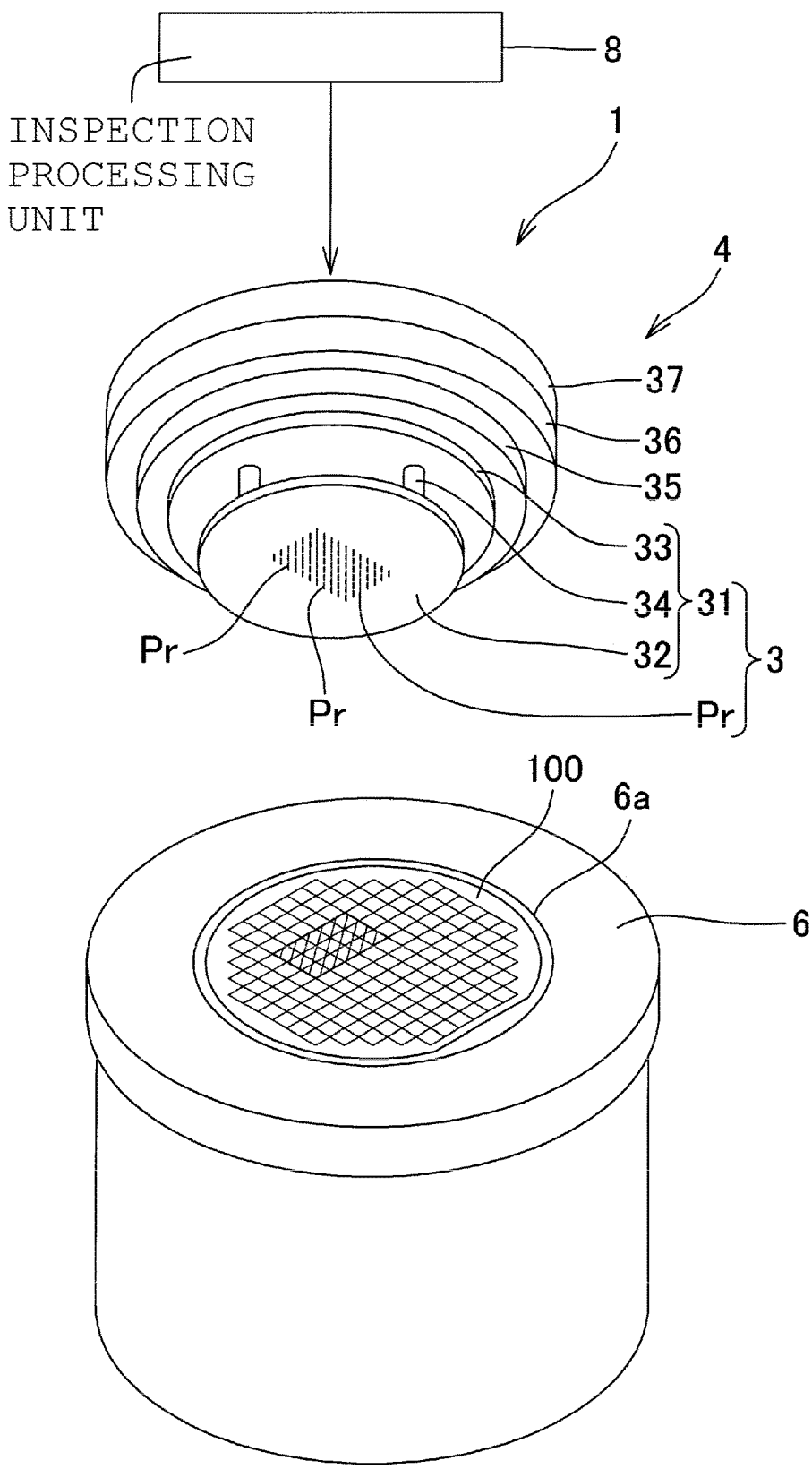
FIG. 1 is a conceptual diagram schematically illustrating a configuration of a semiconductor inspection device provided with a probe according to an embodiment of the present disclosure.

Hereinafter, embodiments of the present disclosure will be described with reference to drawings. Note that components with the same reference numerals in the respective drawings will be the same components and description thereof will be omitted. Further, for convenience of description, even if the drawings have the same configuration, the characteristic ratios of the characteristic portions, length, width, and length ratios, thickness, width, and length ratios may be different between the drawings.

FIG. 1 is a conceptual diagram schematically illustrating a configuration of a semiconductor inspection device 1 provided with a probe according to an embodiment of the present disclosure. The semiconductor inspection device 1 corresponds to an example of an inspection device. The semiconductor inspection device 1 illustrated in FIG. 1 is an inspection device for inspecting a circuit that is formed on a semiconductor wafer 100 that is an example of an inspection object.

In the semiconductor wafer 100, circuits corresponding to a plurality of semiconductor chips are formed, for example, on a semiconductor substrate of a silicon or the like. Note that the inspection object may be an electronic component such as a semiconductor chip, a chip size package (CSP), or a semiconductor element (integrated circuit (IC)) or another target on which electrical inspection is performed.

Also, the inspection device is not limited to a semiconductor inspection device and may be a substrate inspection device that inspects a substrate, for example. The substrate that is an inspection object may be, for example, a substrate such as a printed wiring substrate, a glass epoxy substrate, a flexible substrate, a ceramic multilayered wiring substrate, a package substrate for a semiconductor package, an interposer substrate, or a film carrier, an electrode panel for a display such as a liquid crystal display, an electro-luminescence (EL) display, or a touch panel display, an electrode panel for a touch panel, or substrates of various kinds.

The semiconductor inspection device 1 illustrated in FIG. 1 includes an inspection portion 4, a sample platform 6, and an inspection processing unit 8. A placement portion 6a on which the semiconductor wafer 100 is placed is provided on an upper surface of the sample platform 6, and the sample platform 6 is configured to secure the semiconductor wafer 100 that is an inspection object at a predetermined position.

The placement portion 6a is adapted to be able to be lifted and lowered and is adapted such that the semiconductor wafer 100 accommodated in the sample platform 6 is caused to be lifted to an inspection position and the semiconductor wafer 100 after the inspection is stored in the sample platform 6, for example. Also, the placement portion 6a is adapted to be able to cause the semiconductor wafer 100 to rotate and orient an orientation flat to a predetermined direction, for example. Also, the semiconductor inspection device 1 includes a transport mechanism such as a robot arm, which is not illustrated in the drawing. By the transport mechanism, the semiconductor wafer 100 is placed on the placement portion 6a, and the inspected semiconductor wafer 100 is transported from the placement portion 6a.

The inspection portion 4 includes an inspection jig 3, a first pitch conversion block 35, a second pitch conversion block 36, and a connection plate 37. The inspection jig 3 is a jig for performing inspection by causing a plurality of probes Pr to contact with the semiconductor wafer 100, and for example, the inspection jig 3 is configured by a so-called probe card.

A plurality of chips is formed in the semiconductor wafer 100. A plurality of pads and inspection points such as bumps are formed in each of the chips. Corresponding to a partial region of the plurality of chips formed in the semiconductor wafer 100 (for example, the hatched region in FIG. 1; hereinafter, referred to as an inspection region), the inspection jig 3 holds a plurality of probes Pr such that the probes Pr correspond to the respective inspection points in the inspection region.

If the probes Pr have been caused to contact with the respective inspection points in the inspection region and the inspection in the inspection region is finished, the placement portion 6a lowers the semiconductor wafer 100, the sample platform 6 moves in parallel and causes the inspection region to move, the placement portion 6a causes the semiconductor wafer 100 to be lifted, and inspection is then performed by causing the probes Pr to contact with a new inspection region. In this manner, the entire semiconductor wafer 100 is inspected by performing the inspection while causing the inspection region to sequentially move.

In addition, FIG. 1 is an explanatory diagram schematically and conceptually illustrating an example of the configuration of the semiconductor inspection device 1 from the viewpoint of allowing easy understanding of the disclosure, and the number, the density, and the arrangement of the probes Pr, the shapes, and the ratio between the sizes of the inspection portion 4 and the sample platform 6, and the like are also illustrated in a simple and conceptual manner. For example, the inspection region is illustrated in an enlarged and emphasized manner as compared with a typical semiconductor inspection device in terms of easy understanding of the arrangement of the probes Pr, and the inspection region may be smaller or larger.

The connection plate 37 is configured such that the second pitch conversion block 36 can be detached therefrom and attached thereto. A plurality of electrodes (not illustrated) that are connected to the second pitch conversion block 36 is formed on the connection plate 37. The respective electrodes of the connection plate 37 are electrically connected to the inspection processing unit 8 with cables, connection terminals, or the like (not illustrated), for example. The first pitch conversion block 35 and the second pitch conversion block 36 are pitch conversion members for converting intervals between the probes Pr into an electrode pitch on the connection plate 37.

The inspection jig 3 includes the plurality of probes Pr that have tip ends Pa and base ends Pb, which will be described later, and a support member 31 that holds the plurality of probes Pr such that the tip ends Pa or the base ends Pb thereof are oriented toward the semiconductor wafer 100.

An electrode 352, which is brought into contact with and electrically conductive to the base end Pb or the tip end Pa of each probe Pr, is provided at the first pitch conversion block 35 and will be described later. The inspection portion 4 includes a connection circuit that electrically connects the respective probes Pr of the inspection jig 3 to the inspection processing unit 8 via the connection plate 37, the second pitch conversion block 36 and the first pitch conversion block 35 and switches the connection, which is not illustrated in the drawing.

In this manner, the inspection processing unit 8 is adapted to be able to supply an inspection signal to an arbitrary probe Pr and detects a signal from an arbitrary probe Pr via the connection plate 37, the second pitch conversion block 36 and the first pitch conversion block 35. Details of the first pitch conversion block 35 and the second pitch conversion block 36 will be described later.

The probe Pr has a substantially bar shape as a whole. The support member 31 includes an inspection-side support body 32 (second plate) that is disposed to face the semiconductor wafer 100, an electrode-side support body 33 (first plate) that is disposed at a side opposite to the semiconductor wafer 100 side of the inspection-side support body 32, and a linking member 34 that holds the inspection-side support body 32 and the electrode-side support body 33 parallel to each other with a predetermined distance therebetween.

A plurality of through-holes for supporting the probes Pr is formed in the inspection-side support body 32 and the electrode-side support body 33. The respective through holes are arranged to correspond to the positions of the inspection points set on a wiring pattern of the semiconductor wafer 100 that is an inspection object. In this manner, the tip ends Pa of the probes Pr are adapted to be in contact with the inspection points of the semiconductor wafer 100. For example, the plurality of probes Pr may be arranged at the respective intersection points at which a plurality of first straight lines that are parallel to each other and a plurality of second straight lines that are parallel to each other intersect in a grid pattern. The inspection points are, for example, electrodes, wiring patterns, solider bumps, connection terminals, or the like.

The inspection jig 3 is adapted to be replaceable in accordance with the semiconductor wafer 100 that is an inspection object.

Figure 2:
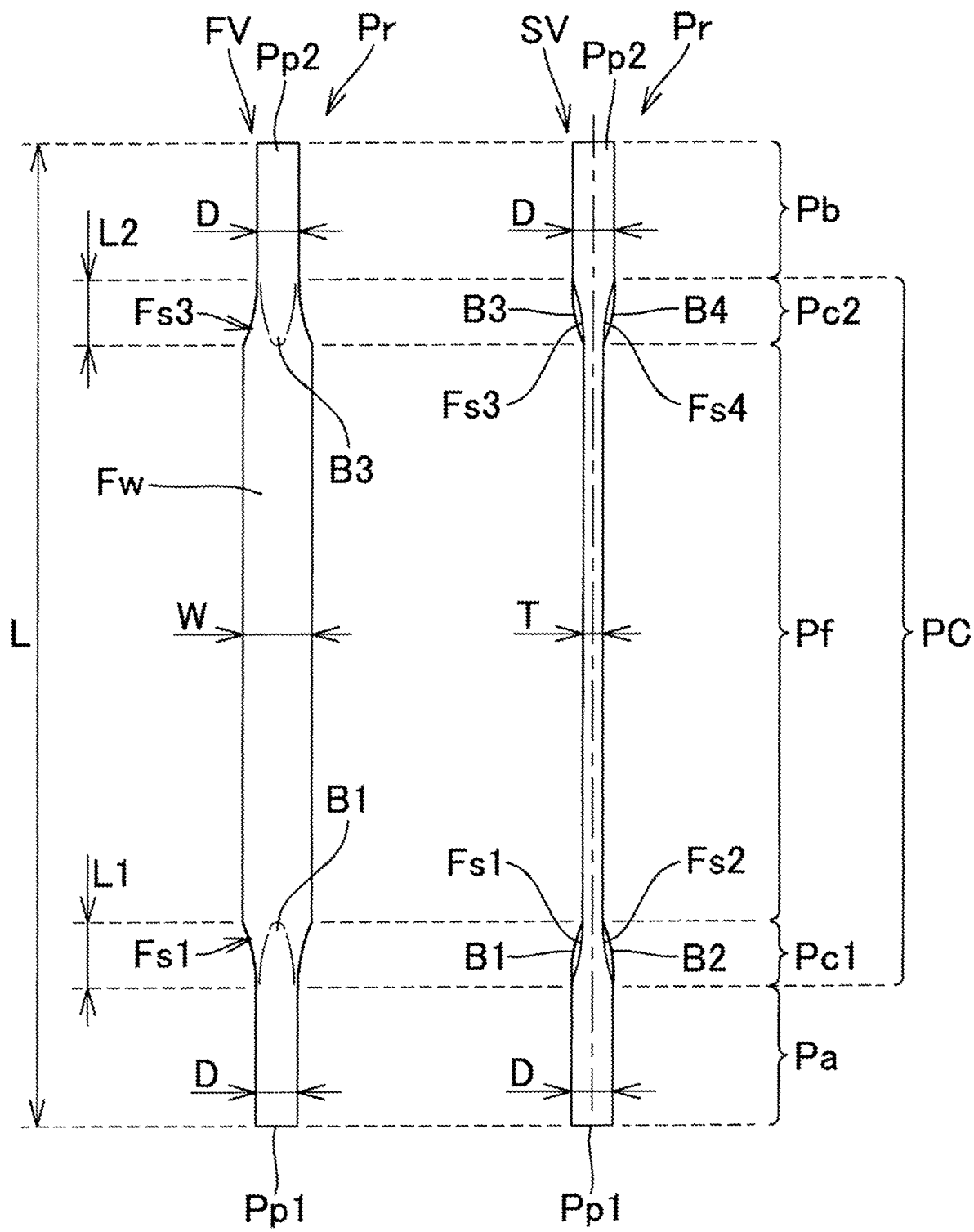
FIG. 2 is a front view and a side view of an example of the probe illustrated in FIG. 1.

FIG. 2 illustrates a front view FV and a side view SV of the probe Pr illustrated in FIG. 1. The probe Pr illustrated in FIG. 2 has a substantially bar shape as a whole. The probe Pr includes the tip end Pa with a substantially columnar shape, a body portion PC that is continuous with the tip end Pa, and the base end Pb that is continuous with the body portion PC.

The tip end Pa corresponds to an example of one end, and the base end Pb corresponds to an example of the other end. In addition, the tip end Pa may be regarded as the other end while the base end Pb may be regarded as one end.

Each probe Pr may be used such that the tip end Pa is caused to contact with the inspection object and the base end Pb is caused to contact with the electrode 352 of the first pitch conversion block 35, or such that the tip end Pa is caused to contact with the electrode 352 of the first pitch conversion block 35 and the base end Pb is caused to contact with the inspection object.

The shape of an apex portion Pp1 at a tip end of the tip end Pa and an apex portion Pp2 at a tip end of the base end Pb may be flat, or may be a conical shape, a spherical surface shape, or a so-called crown shape provided with a plurality of protrusions, and can be various shapes. The shapes of the apex portions Pp1 and the apex portions Pp2 may be different from each other.

Each probe Pr may be used such that a portion obtained by working a round-bar wire material (wire) with a substantially columnar shape for example (a metal material with conductivity or the like) to be flat through press working or the like is regarded as the body portion PC, and portions on the both sides thereof, which are not press worked, are regarded as the tip end Pa and the base end Pb. Since the probe Pr include the body portion PC worked to be flat, it is possible to increase the surface area of the probe Pr. Therefore, a skin effect of a current further increases, and the probe Pr makes the current pass therethrough easily.

The body portion PC has a substantially constant thickness, and includes a flat portion Pf whose both surfaces are flat surfaces Fw, a first connection region Pc1 connecting the flat portion Pf and the tip end Pa, and a second connection region Pc2 connecting between the flat portion Pf and the base end Pb.

Figure 3:
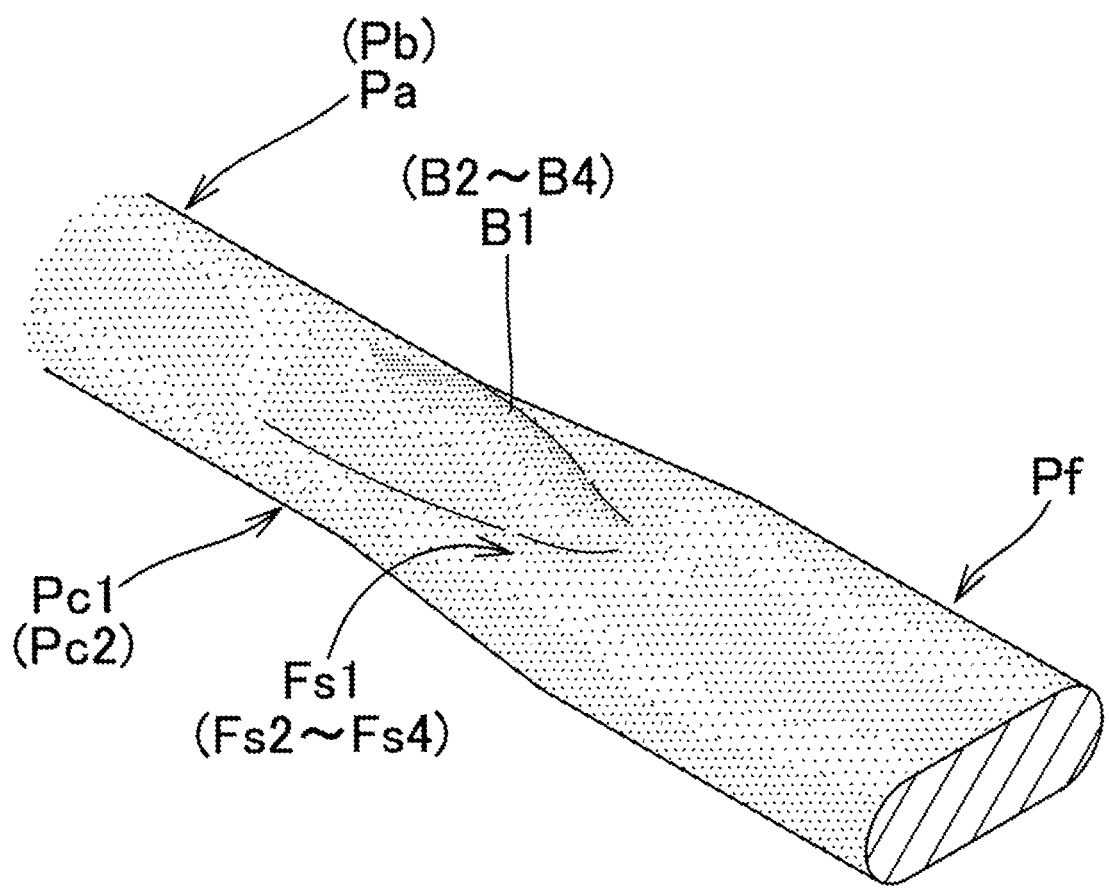
FIG. 3 is a partially enlarged perspective view illustrating the vicinity of a first connection region of the probe illustrated in FIG. 2 on an enlarged scale.
Figure 4:
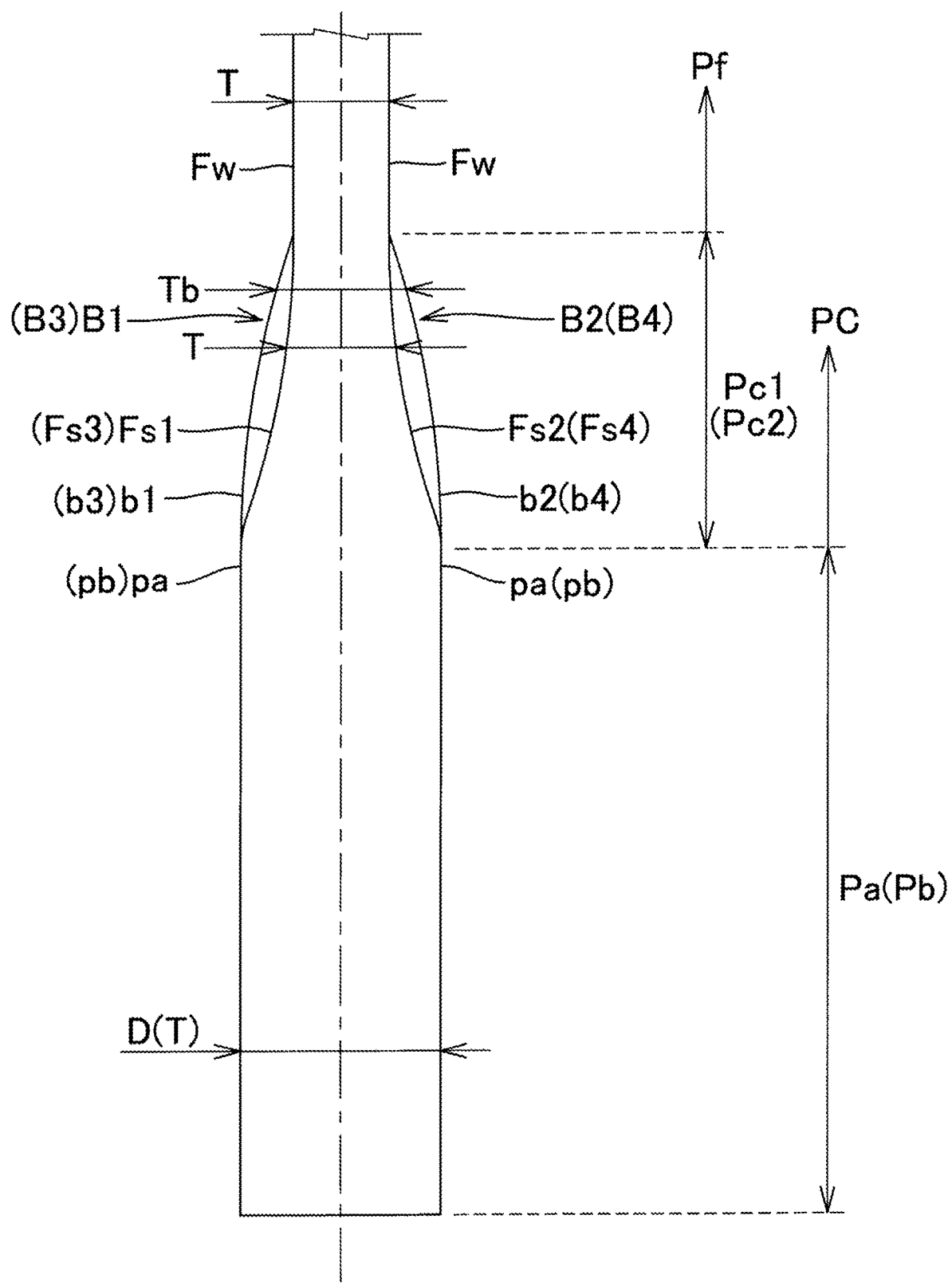
FIG. 4 is a partially enlarged view illustrating the vicinity of the first connection region in the side view of the probe illustrated in FIG. 2 on an enlarged scale.
Figure 5:
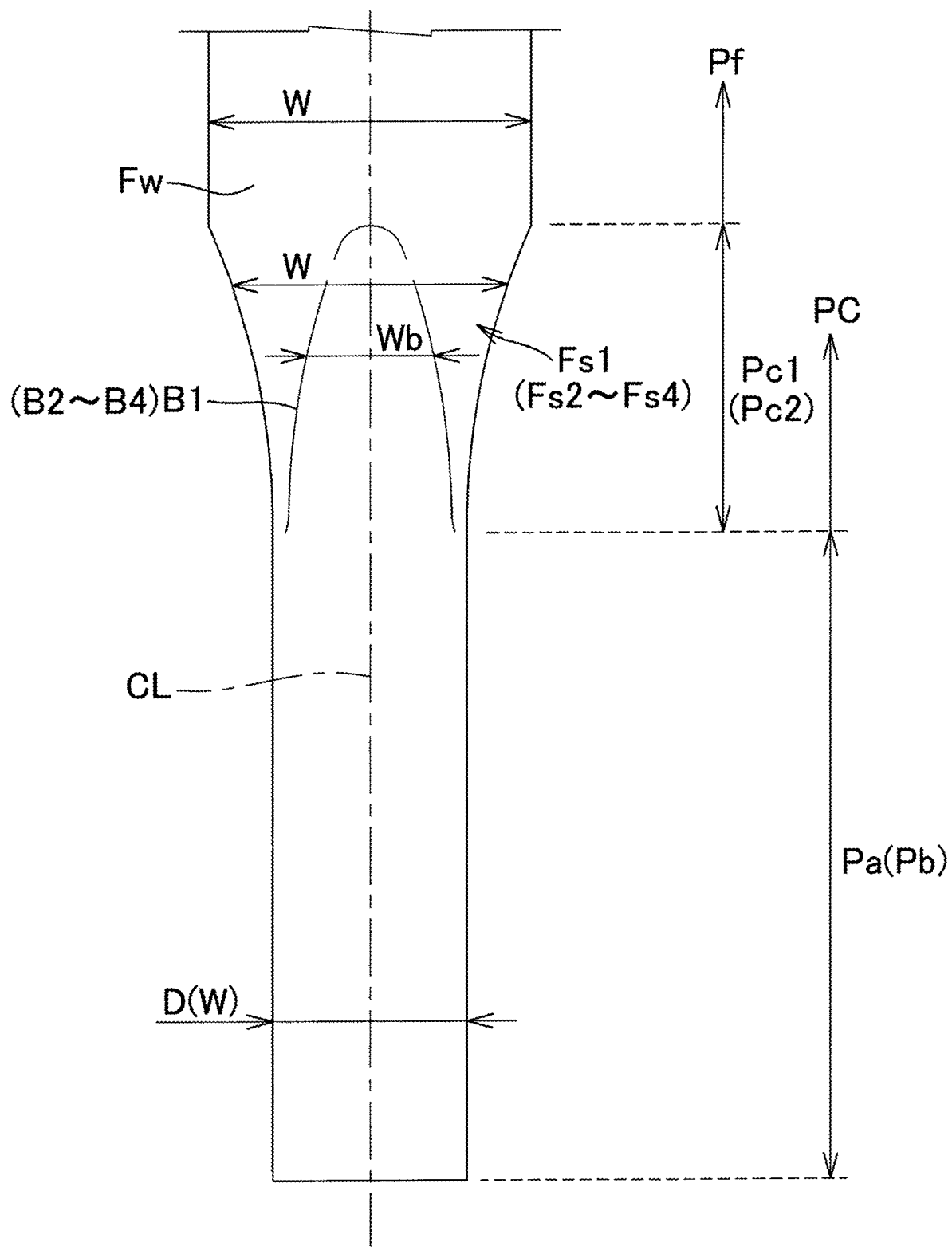
FIG. 5 is a partially enlarged view illustrating the vicinity of the first connection region in the front view of the probe illustrated in FIG. 2 on an enlarged scale.

FIG. 3 is a partially enlarged perspective view illustrating the vicinity of the first connection region Pc1 of the probe Pr illustrated in FIG. 2 on an enlarged scale. FIG. 4 is a partially enlarged view illustrating the vicinity of the first connection region Pc1 in the side view SV of the probe Pr illustrated in FIG. 2 on an enlarged scale. FIG. 5 is a partially enlarged view illustrating the vicinity of the first connection region Pc1 in the front view FV of the probe Pr illustrated in FIG. 2 on an enlarged scale.

The first connection region Pc1 and the second connection region Pc2 have substantially the same configuration except that they are connected to the tip end Pa or the base end Pb. The front and back surfaces of the probe Pr are constructed in substantially the same manner. FIGS. 3 to 10 illustrate the vicinity of the second connection region Pc2 and the front and back surfaces of the probe Pr, and reference numerals indicating the configuration of the vicinity of the second connection region Pc2 and the configuration of the back side of the first connection region Pc1 are illustrated in parentheses.

A slope surface Fs1 (first slope surface) is formed in the first connection region Pc1 of the body portion PC, which is continuous with the tip end Pa, inclined with respect to the axial direction in a direction that the thickness T in the thickness direction orthogonal to the axial direction of the probe Pr becomes gradually narrower with increasing distance from the tip end Pa, and has a width W in the width direction orthogonal to both the thickness direction and the axial direction. A region B1 (first region) having a curved shape that bulges outward is provided in a part of the slope surface Fs1.

The slope surface Fs1 and the region B1 are provided on one side in the thickness direction of the body portion PC. On the other side of the body portion PC, a slope surface Fs2 (second slope surface) and a region B2 (second region) configured similarly to the slope surface Fs1 and the region B1 are provided. The thickness T of the portion sandwiched between the slope surface Fs1 and the slope surface Fs2 becomes gradually narrower with increasing distance from the tip end Pa, and becomes equal to the thickness T of the flat portion Pf. The slope surface Fs1 and the slope surface Fs2 are continuous with the flat surfaces Fw on both sides of the flat portion Pf.

The surfaces b1 and b2 of the regions B1 and B2 are continuous with an outer peripheral surface pa of the tip end Pa. The regions B1 and B2 are located on the center line CL in the width direction of the slope surfaces Fs1 and Fs2. The widths Wb of the regions B1 and B2 in the width direction become gradually narrower as the distance from the tip end Pa increases. Further, the regions B1 and B2 may include a portion having a constant width Wb until they are separated from the tip end Pa by a predetermined distance, and may become gradually narrower from a position separated from the tip end Pa by a predetermined distance as the distance increases from the tip end Pa.

The slope surfaces Fs1 and Fs2 have a shape in which the width W gradually expands in a straight line shape or a curved shape with increasing distance from the tip end Pa.

A slope surface Fs3 (third slope surface) is formed in the second connection region Pc2 of the body portion PC, which is continuous with the base end Pb, inclined with respect to the axial direction in a direction that the thickness T becomes gradually narrower with increasing distance from the base end Pb, and has a width W in the width direction orthogonal to the thickness direction and the axial direction. A region B3 (third region) having a curved surface shape that bulges outward is provided in a part of the slope surface Fs3.

The slope surface Fs3 and the region B3 are provided on the same side of the body portion PC as the slope surface Fs1. On the same side as the slope surface Fs2, a slope surface Fs4 (third slope surface) and a region B4 (third region) configured similarly to the slope surface Fs3 and the region B3 are provided. The thickness T of the portion sandwiched between the slope surface Fs3 and the slope surface Fs4 becomes gradually narrower with increasing distance from the base end Pb, and becomes equal to the thickness T of the flat portion Pf. The slope surfaces Fs3 and Fs4 are continuous with the flat surfaces Fw on both sides of the flat portion Pf.

Surfaces b3 and b4 of the regions B3 and B4 are continuous with an outer peripheral surface pb of the base end Pb. The regions B3 and B4 are located on the center line CL in the width direction of the slope surfaces Fs3 and Fs4. The widths Wb of the regions B3 and B4 in the width direction become gradually narrower as the distance from the base end Pb increases. Further, the regions B3 and B4 may include a portion having a constant width Wb until they are separated from the base end Pb by a predetermined distance, and may become gradually narrower from a position separated from the base end Pb by a predetermined distance as the distance increases from the base end Pb.

The slope surfaces Fs3 and Fs4 have a shape in which the width W gradually expands in a straight line shape or a curved shape with increasing distance from the base end Pb.

The flat portion Pf has a flat shape in which the thickness t is smaller than the width W. Therefore, the flat portion Pf is more likely to bend in the thickness direction than in the width direction. In this manner, the probe Pr is adapted such that the bending direction can be controlled. Also, since the width W of the flat portion Pf is set to be larger than the diameter D of the tip end Pa and the base end Pb, the bending direction is controlled and strength can be applied to the body portion PC due to the width W.

The length L of the probe Pr ranges from 3.0 to 8.0 mm, for example. The length of the tip end Pa and the base end Pb ranges from 0.8 to 1.6 mm or ranges from 0.3 to 0.6 mm, for example. In addition, the length of the tip end Pa and the length of the base end Pb may be different from each other. The diameter D of the tip end Pa and the base end Pb ranges from 30 to 100 μm or ranges from 50 to 65 μm, for example.

The flat portion Pf of the probe Pr has a flattened band-like (ribbon) shape, and the width W and the thickness T thereof are substantially constant in the axial direction. The thickness T of the flat portion Pf is set to be about ½ of the diameter D, for example, or is set to be equal to or greater than ⅓ and equal to or less than ⅔ of the diameter D. For example, the thickness T is set to be about 30 μm.

The width W of the flat portion Pf ranges from 40 to 120 μm or 60 to 90 μm, for example. In addition, the width W of the flat portion Pf is not necessarily limited to a substantially constant width in the axial direction.

The length L1 of the first connection region Pc1, that is, the axial lengths L1 of the slope surfaces Fs1 and Fs2, and the length L2 of the second connection region Pc2, that is, the axial lengths L2 of the slope surfaces Fs3 and Fs4 are 20 to 600 μm for example. The lengths L1 and L2 may be different from each other.

The lengths, the widths, and the thicknesses of the respective portions of the above-described probe Pr are just examples and can be appropriately set.

Although an example in which parts of the slope surfaces Fs1 to Fs4 are set as the regions B1 to B4 is illustrated, the entire slope surfaces Fs1 to Fs4 may be set to the regions B1 to B4.

Figure 6:
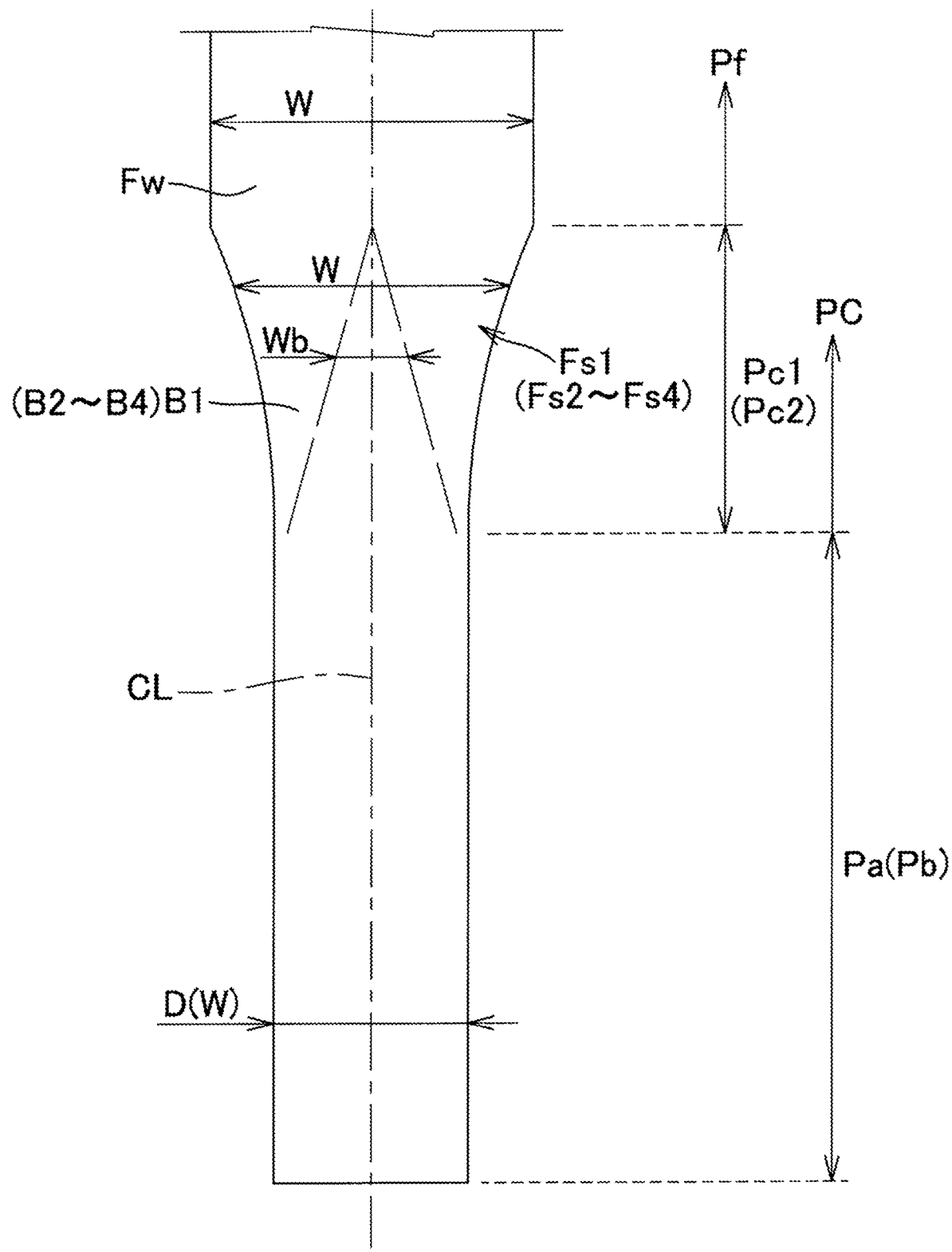
FIG. 6 is a front view illustrating a modification of the region illustrated in FIG. 5.
Figure 7:
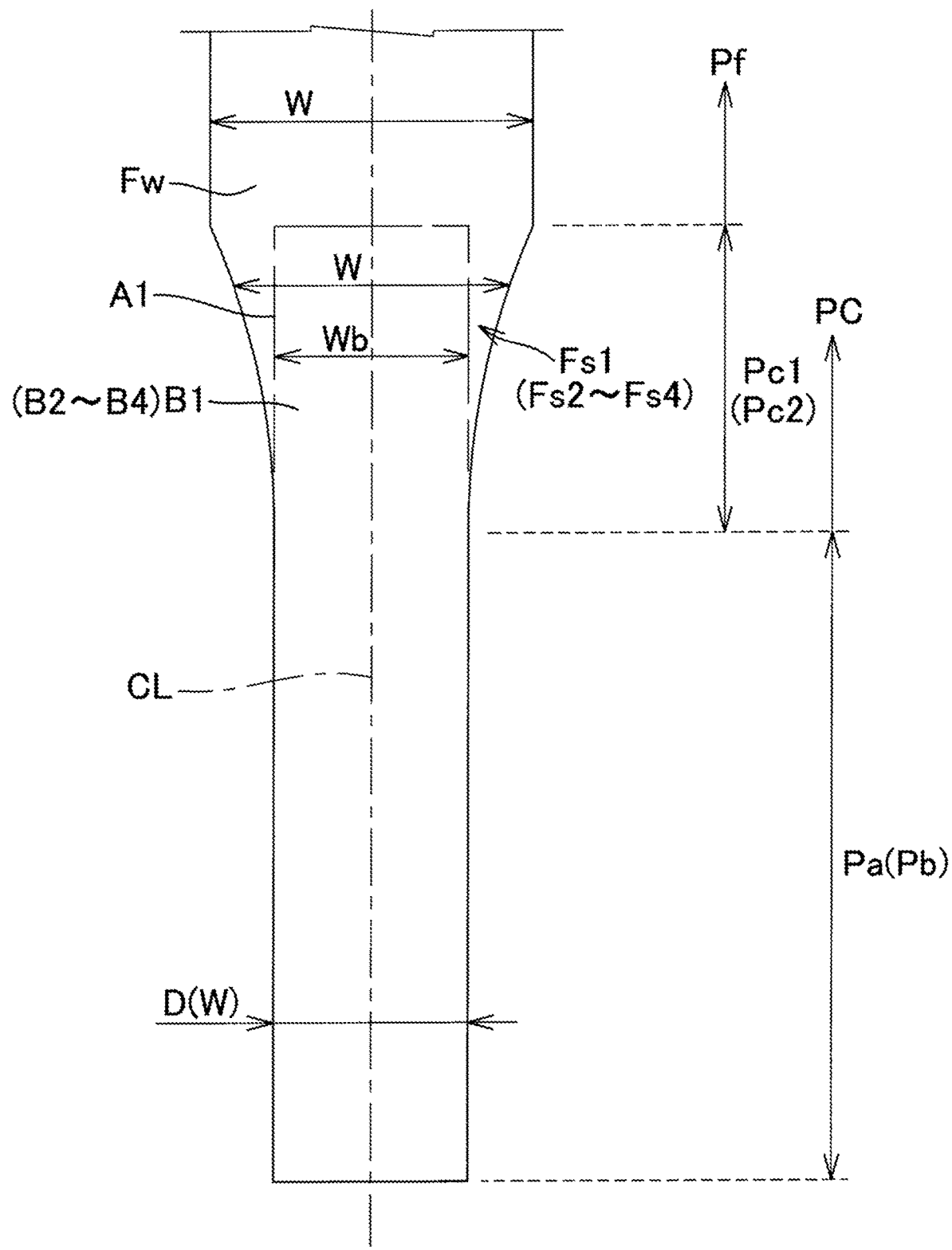
FIG. 7 is a front view illustrating a modification of the region illustrated in FIG. 5.

FIGS. 6 and 7 are front views illustrating modifications of the regions B1 to B4 illustrated in FIG. 5. As illustrated in FIG. 6, the widths Wb of the regions B1 to B4 may be linearly and gradually narrowed with increasing distance from the tip end Pa or the base end Pb. Further, as illustrated in FIG. 7, the regions B1 to B4 may be partial regions A1 having a substantially constant width Wb with respect to the positional change in the axial direction, and parts of the regions B1 to B4 may be the partial regions A1.

Figure 8:
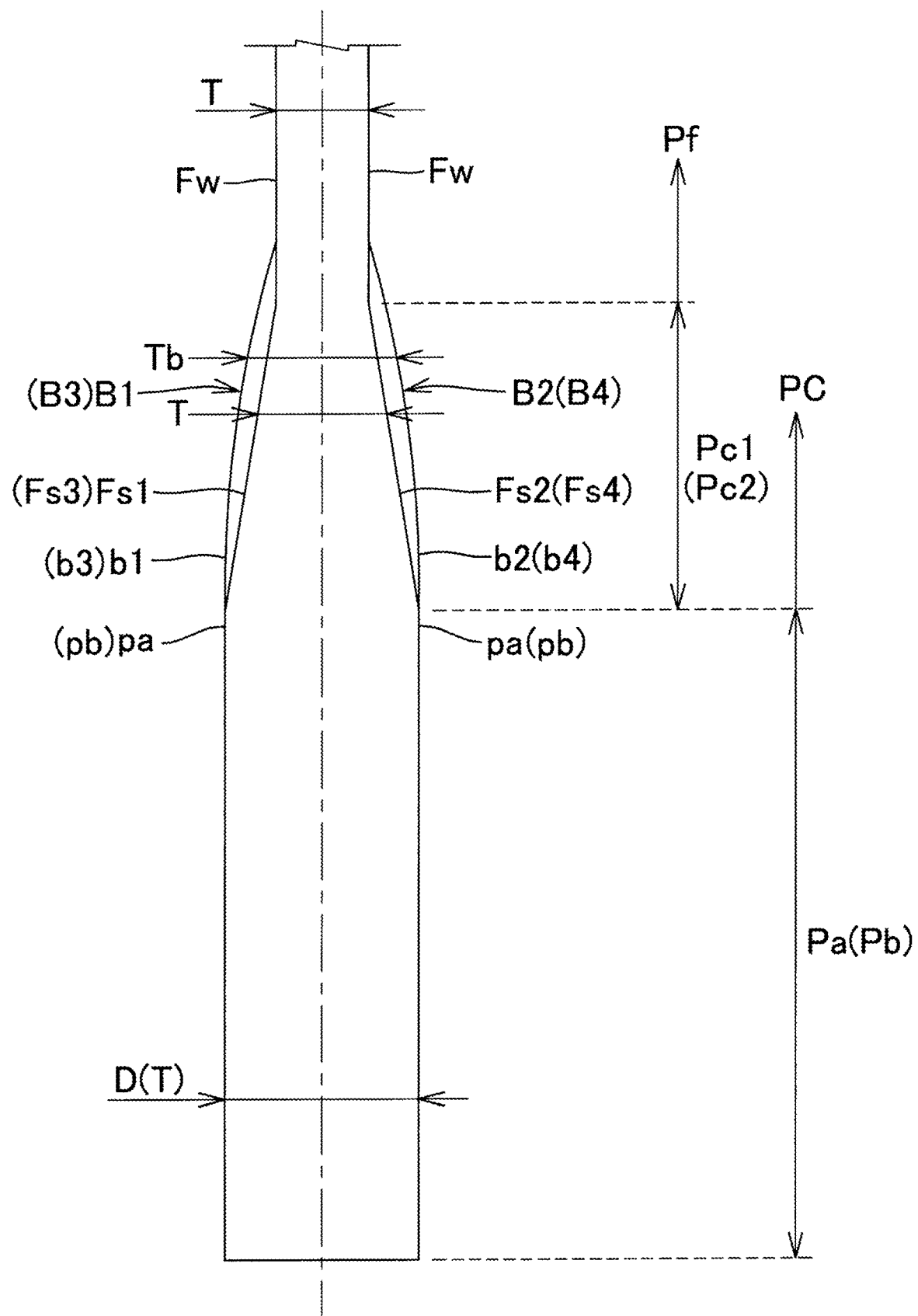
FIG. 8 is a side view illustrating a modification of the region illustrated in FIG. 4.
Figure 9:
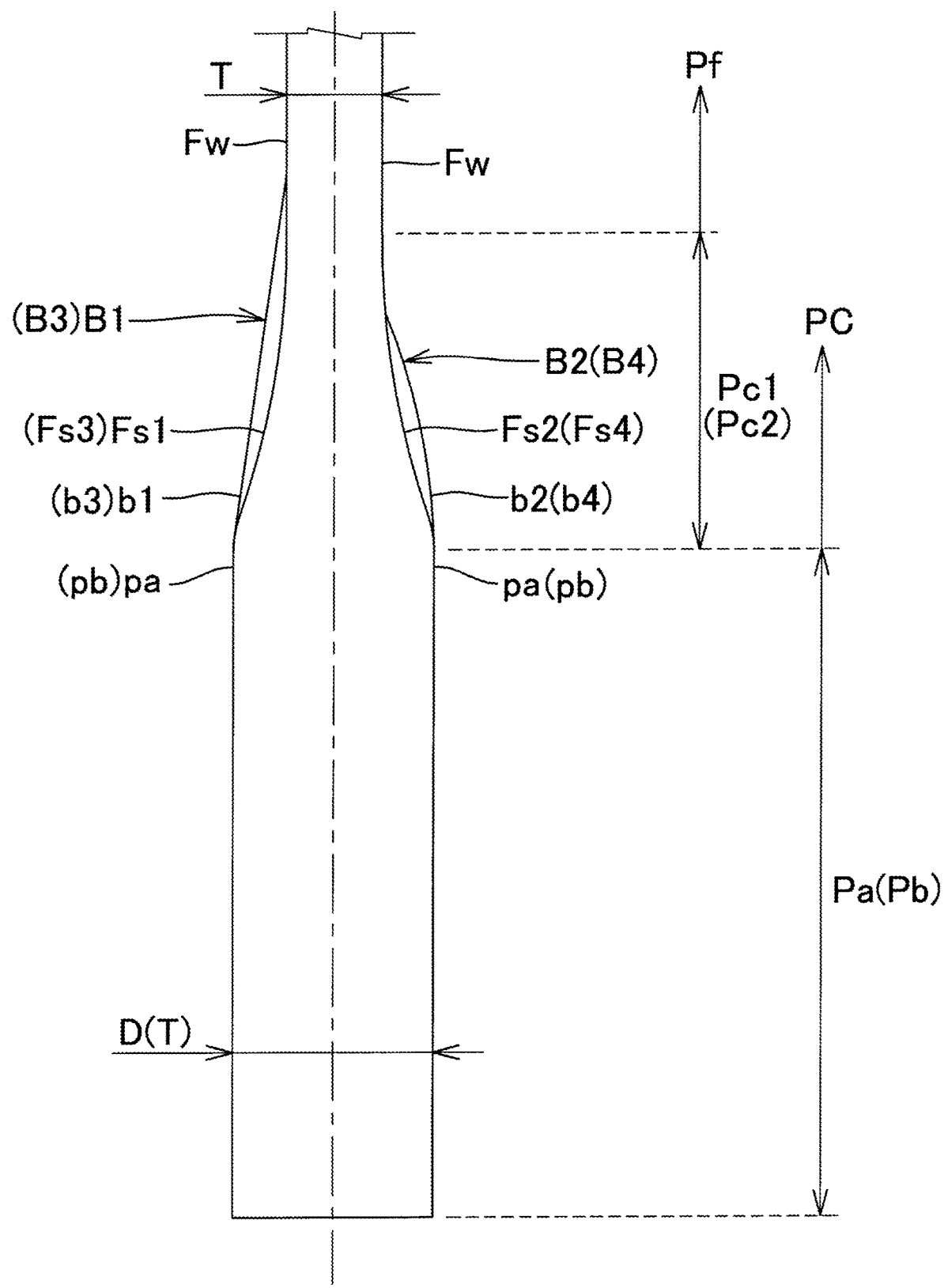
FIG. 9 is a side view illustrating a modification of the region illustrated in FIG. 4.
Figure 10:
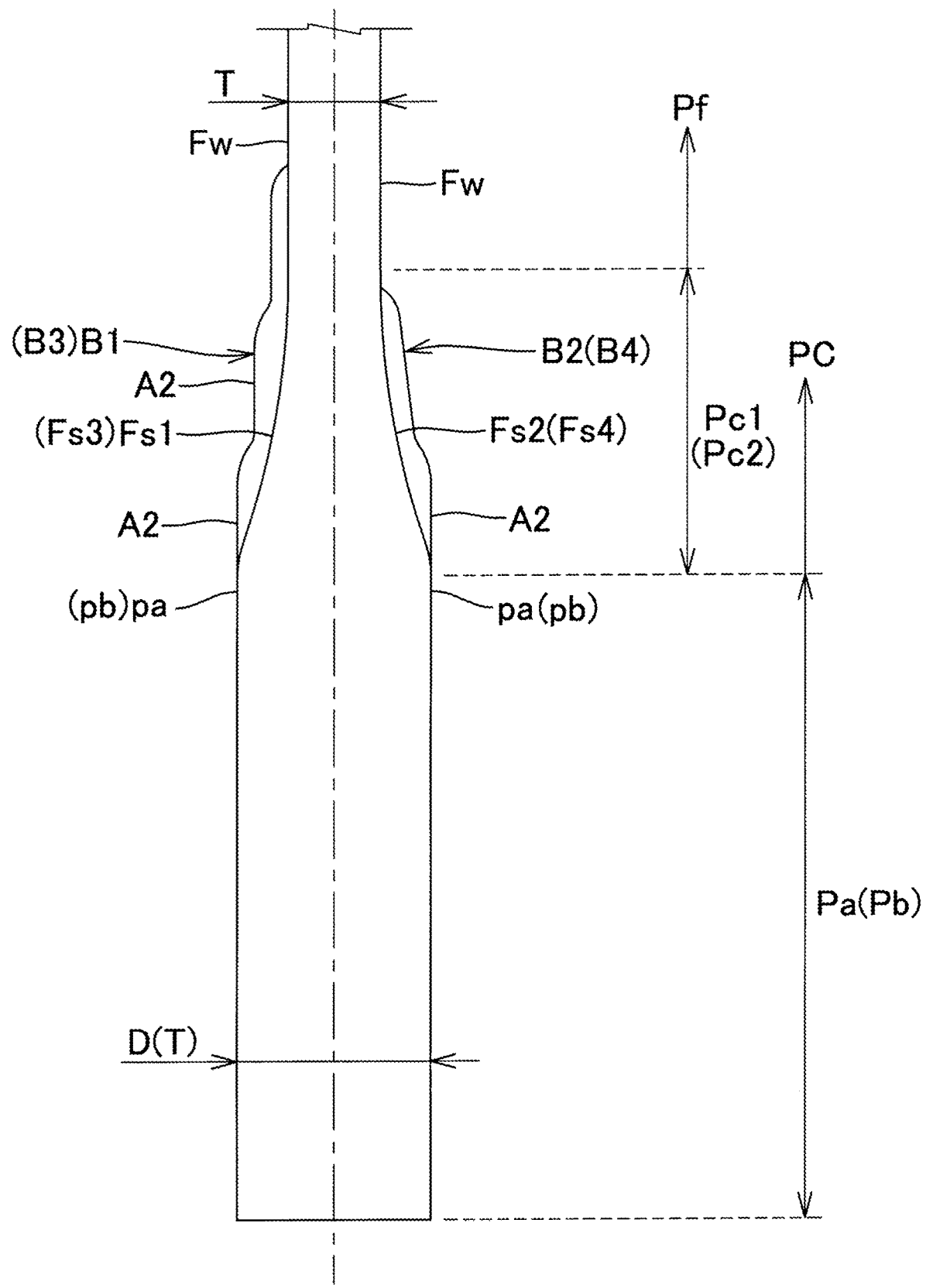
FIG. 10 is a side view illustrating a modification of the region illustrated in FIG. 4.

FIGS. 8 to 10 are side views illustrating modifications of the regions B1 to B4 illustrated in FIG. 4. In the above example, the regions B1 to B4 are illustrated as examples provided only on the slope surfaces Fs1 to Fs4, but as illustrated in FIG. 8, for example, the regions B1 to B4 may be provided to straddle the slope surfaces Fs1 to Fs4 and the flat surface Fw.

Further, for example, like the regions B1 and B3 illustrated in FIG. 9, the ridgeline of the region (outer edge in side view) extends linearly, and the regions B1 and B3 may be provided to straddle the slope surfaces Fs1 and Fs3 and the flat surface Fw.

Further, for example, like regions B1 to B4 illustrated in FIG. 10, a partial region A2 may be included in which the distance from the bar-like shaft center is substantially constant with respect to a change in axial position.

Further, the body portion PC does not necessarily have to include the slope surfaces Fs1 to Fs4 and the regions B1 to B4. The body portion PC may include at least one of the slope surfaces Fs1 to Fs4 and at least one of the regions B1 to B4.

Further, for example, like the regions B1 and B3 and the regions B2 and B4 illustrated in FIG. 9, or the regions B1 and B3 and the regions B2 and B4 illustrated in FIG. 10, the shapes of the respective regions may be different on the front and back sides of the probe Pr. Further, the shapes of the regions B1 and B2 and the regions B3 and B4 may be different. The slope surfaces Fs1 to Fs4 and the regions B1 to B4 may have configurations different from each other, and the probe Pr can be obtained by arbitrarily combining the above configurations.

The slope surfaces Fs1 to Fs4 may have a linear slope or a curved slope.

Further, the flat portion Pf may not necessarily have a constant thickness t, and the surface thereof is not limited to a flat shape. The widths W of the slope surfaces Fs1 to Fs4 are not necessarily limited to the example in which the widths W (diameters D) of the tip end Pa and the base end Pb are widened, and may be as large as the widths W (diameters D) of the tip end Pa and the base end Pb.

The probe Pr is not limited to a linearly extending shape, and may have a curved shape, for example, a curved shape, an arc shape, an S shape, or the like.

Figure 11:
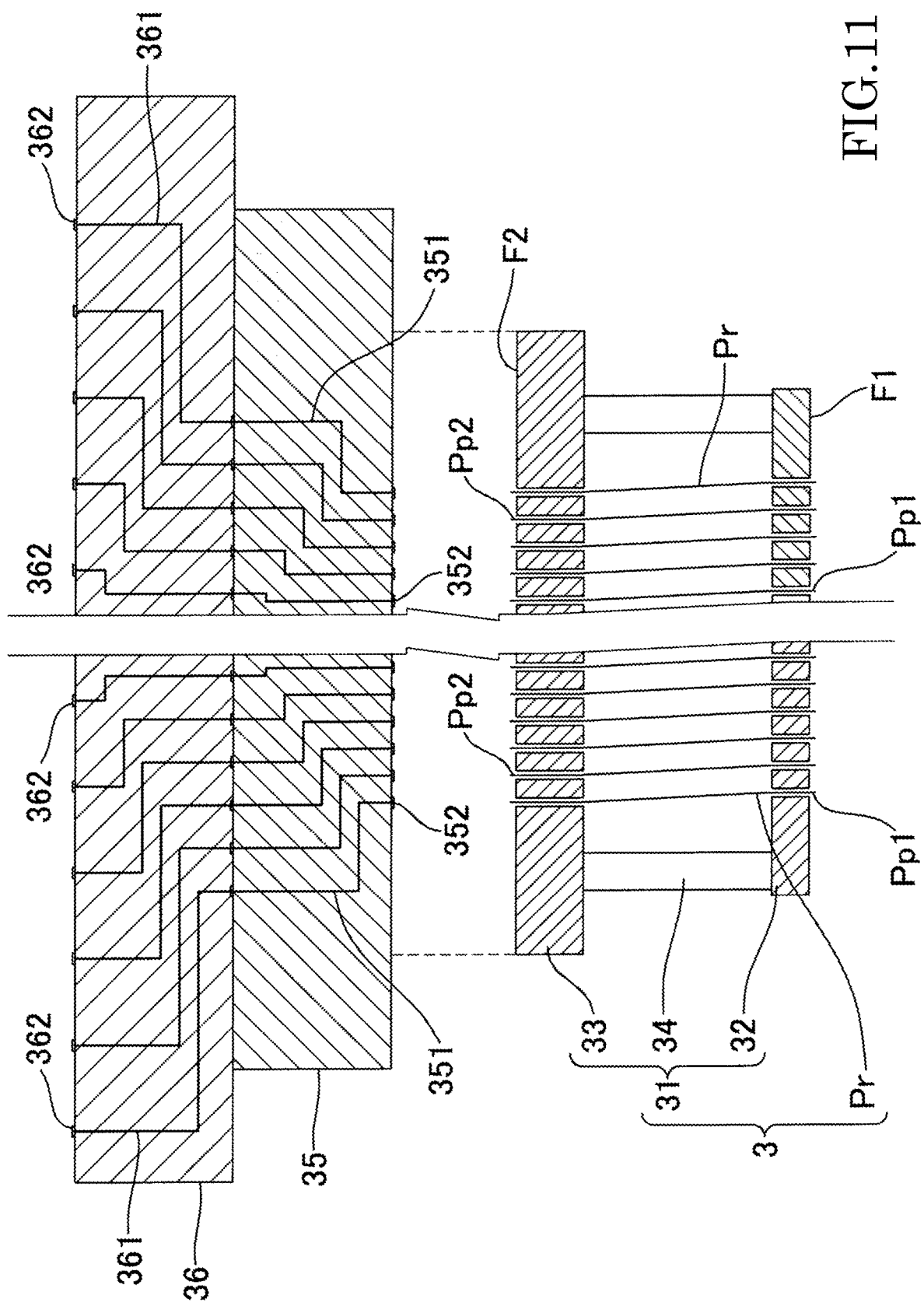
FIG. 11 is a cross-sectional view of the inspection jig illustrated in FIG. 1, a first pitch conversion block, and a second pitch conversion block.

FIG. 11 is a cross-sectional view of the inspection jig 3 illustrated in FIG. 1, the first pitch conversion block 35, and the second pitch conversion block 36. FIG. 11 illustrates a state where the inspection jig 3 and the first pitch conversion block 35 are separated. The inspection-side support body 32 has a facing surface F1 arranged to face the semiconductor wafer 100. The electrode-side support body 33 has a rear surface F2 that is brought into a close contact with a lower surface of the first pitch conversion block 35. The apex portion Pp2 of the probe Pr slightly protrudes from the rear surface F2.

Each of the first pitch conversion block 35 and the second pitch conversion block 36 has a substantially cylindrical shape that is flattened in the axial direction, for example. A plurality of electrodes 352 is formed in the lower surface of the first pitch conversion block 35 that is brought into close contact with the rear surface F2 such that the electrodes 352 correspond to the arrangement of the apex portion Pp2 of each probe Pr. A plurality of electrodes arranged at a wider interval than the plurality of electrodes 352 is formed on the upper surface of the first pitch conversion block 35. The electrodes 352 on the lower surface and the electrodes on the upper surface of the first pitch conversion block 35 are connected to each other with wires 351.

A plurality of electrodes is formed in the lower surface of the second pitch conversion block 36 such that the electrodes correspond to the arrangement of the electrodes on the upper surface of the first pitch conversion block 35. A plurality of electrodes 362 formed corresponding to the arrangement of the electrode on the aforementioned connection plate 37 is formed on the upper surface of the second pitch conversion block 36. The electrodes on the lower surface and the electrodes 362 on the upper surface of the second pitch conversion block 36 are connected to each other with wires 361.

In this manner, the inspection processing unit 8 can input and output a signal to and from each probe Pr by assembling the inspection jig 3, the first pitch conversion block 35, and the second pitch conversion block 36 and attaching the second pitch conversion block 36 to the connection plate 37.

The first pitch conversion block 35 and the second pitch conversion block 36 can be configured using multilayered wiring substrates of, for example, multi-layer organic (MLO), multi-layer ceramic (MLC), or the like.

Figure 12:
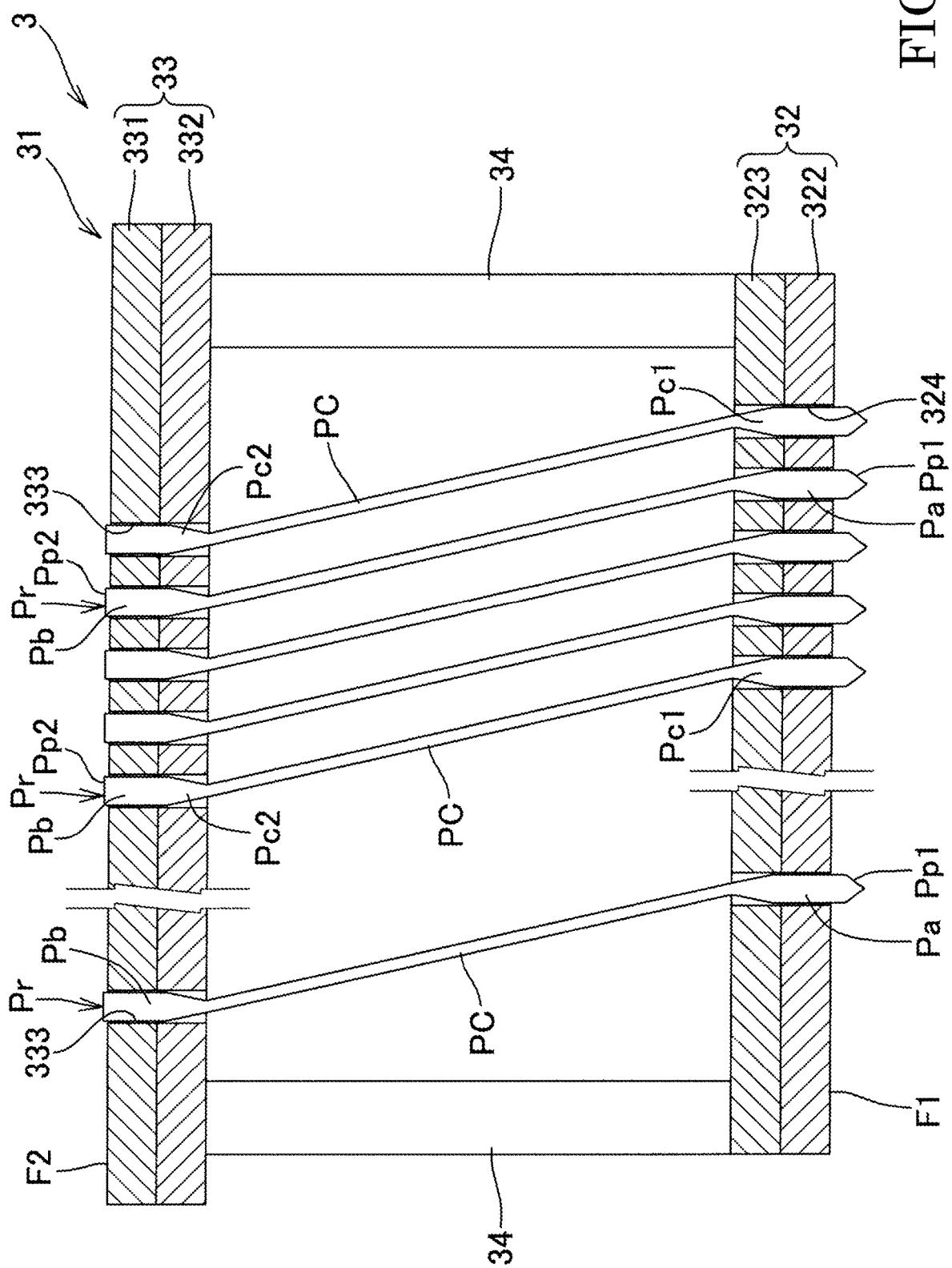
FIG. 12 is a cross-sectional view illustrating an example of a configuration of the inspection jig illustrated in FIG. 1.

FIG. 12 is a cross-sectional view illustrating an example of a configuration of the inspection jig 3 illustrated in FIGS. 1 and 11. The inspection-side support body 32 is configured by a facing plate 322 and a guide plate 323 being laminated. The facing plate 322 has a facing surface F1 arranged to face the semiconductor wafer 100. The facing plate 322 is integrally secured to the guide plate 323 with a detachable securing means such as a bolt.

A plurality of probe insertion holes 324 (second through-holes) into which the tip ends Pa of the probes Pr are inserted is formed in the inspection-side support body 32. Each probe insertion hole 324 guides the apex portion Pp1 of each probe Pr to each of the plurality of inspection points provided on the semiconductor wafer 100. Each probe Pr is arranged such that at least a part of the first connection region Pc1 of the probe Pr is located in the probe insertion hole 324.

The electrode-side support body 33 is configured such that a support plate 331 and a spacer plate 332 are laminated in this order from the side opposite to the facing surface F1. The surface of the support plate 331 on the side opposite to the facing surface F1 is regarded as a rear surface F2. A plurality of probe support holes 333 (first through-holes) corresponding to the plurality of probe insertion holes 324 is formed in the electrode-side support body 33.

The electrode-side support body 33 corresponds to an example of the first plate, the inspection-side support body 32 corresponds to an example of the second plate, the probe support hole 333 corresponds to an example of the first through-hole, and the probe insertion hole 324 corresponds to an example of the second through-hole. Note that the electrode-side support body 33 may be regarded as the second plate, the inspection-side support body 32 may be regarded as a first plate, the probe support hole 333 may be regarded as the second through-hole, and the probe insertion hole 324 may be regarded as the first through-hole.

The base ends Pb of the probes Pr are inserted into the probe support holes 333. The apex portions Pp2 of the base ends Pb slightly protrudes from the rear surface F2. In this manner, the base ends Pb of the respective probes Pr are caused to abut on the electrodes 352 of the first pitch conversion block 35 such that the base ends Pb can be connected to the inspection processing unit 8 in a conductive manner.

Each probe Pr is arranged such that at least a part of the second connection region Pc2 of the probe Pr is located in the probe support hole 333.

In addition, each of the inspection-side support body 32 and the electrode-side support body 33 is not limited to the example that each of them is configured by a plurality of plates being laminated and may be configured by a single plate. Also, a configuration in which the base end Pb is inserted into the probe insertion hole 324 of the inspection-side support body 32 and the tip end Pa is inserted into the probe support hole 333 of the electrode-side support body 33 may be employed. In addition, a configuration in which the base end Pb is caused to abut on the inspection object and the tip end Pa is caused to abut on the electrode 352 of the first pitch conversion block 35 may be employed.

FIG. 12 is a cross-sectional view taken along the thickness direction of each probe Pr, the left-right direction on the sheet surface corresponds to the thickness direction of each probe Pr, and the depth direction on the sheet surface corresponds to the width direction of each probe Pr. The orientation of each probe Pr is aligned such that the thickness direction (width direction) is oriented in the same direction.

The inspection-side support body 32 and the electrode-side support body 33 are arranged such that the corresponding probe insertion holes 324 and the probe support holes 333 are located at positions deviating in the thickness direction of the respective probes Pr. In this manner, the probes Pr inserted into the corresponding probe insertion holes 324 and the probe support holes 333 are held in an inclined or a curved state relative to the vertical lines of the facing surface F1 and the rear surface F2 between the inspection-side support body 32 and the electrode-side support body 33.

In addition, the mutually corresponding probe insertion holes 324 and the probe support holes 333 are not necessarily limited to the example in which the probe insertion holes 324 and the probe support holes 333 are located at the positions deviating in the thickness direction of the respective probes Pr. A configuration in which the mutually corresponding probe insertion holes 324 and the probe support holes 333 are located on the vertical line of the facing surface F1 may also be employed. If the configuration in which the mutually corresponding probe insertion holes 324 and the probe support holes 333 are located on the vertical line of the facing surface F1 is employed, it is easy to insert the probes Pr into the probe insertion holes 324 and the probe support holes 333, and for example, it is easy to mechanize the operation of inserting the probes Pr.

Figure 13:
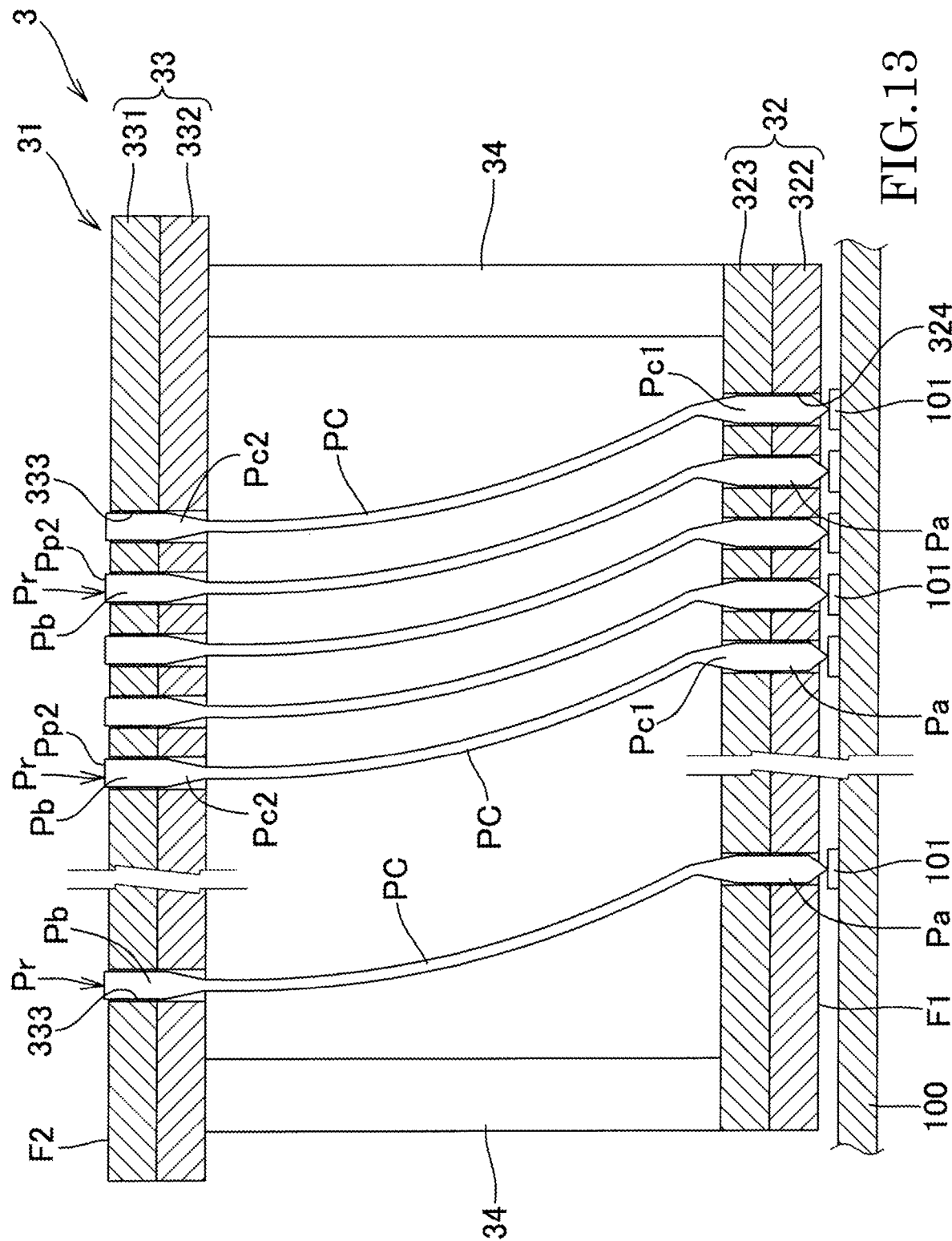
FIG. 13 is an explanatory diagram illustrating a state in which a semiconductor wafer is caused to abut on the inspection jig illustrated in FIG. 12 and an inspection point formed on the surface of the semiconductor wafer is in contact with a tip end of each probe.

FIG. 13 illustrates a state in which the semiconductor wafer 100 is caused to abut on the inspection-side support body 32 of the inspection jig 3 illustrated in FIG. 12 and inspection points 101 formed on the surface of the semiconductor wafer 100 are in contact with the tip ends Pa of the respective probes Pr. As illustrated in FIG. 13, if the inspection points 101 is pressed against the tip ends Pa and the protruding portions of the tip ends Pa are pressed into the probe insertion holes 324. The body portions PC of the respective probes Pr are bent.

As illustrated in FIG. 12, since the respective probes Pr are held in an inclined or curved state relative to the vertical lines of the facing surface F1 and the rear surface F2, the body portions PC are smoothly bent due to a pressing force when the apex portions Pp1 protruding from the facing surface F1 are caused to abut on and are pressed against the inspection points. The probes Pr causes spring properties by being bent. As a result, it is possible to cause the apex portions Pp1 to be elastically in contact with the inspection points due to elastic force of the body portion PC and thereby to improve contact stability.

Here, when the probe Pr bends by pressing the tip end Pa to the inspection point 101, the force to bend the probe Pr is easy to concentrate on the first connection region Pc1 and the second connection region Pc2 which are places where the thickness of the probe Pr changes. Therefore, if the probe Pr does not include the region B1 and the region B3, strain is likely to concentrate on the first connection region Pc1 and the second connection region Pc2.

However, the probe Pr has regions B1 to B4 on the slope surfaces Fs1 to Fs4 in the first connection region Pc1 and the second connection region Pc2. Therefore, as compared with the case where the slope surfaces Fs1 to Fs4 are flat slopes, the swelling due to the regions B1 to B4 reinforces the first connection region Pc1 and the second connection region Pc2. As a result, even when the force to bend the probe Pr is concentrated on the first connection region Pc1 and the second connection region Pc2, strain is less likely to concentrate on the first connection region Pc1 and the second connection region Pc2.

Further, since the regions B1 to B4 have a curved surface shape that bulges outward, the shapes of the regions B1 to B4 change smoothly and continuously with respect to changes in the position in the axial direction. Therefore, the force to bend the probe Pr does not concentrate on a specific place of the regions B1 to B4. As a result, strain is less likely to concentrate on the regions B1 to B4.

Further, at the connecting position, that is, the boundary position between the tip end Pa and the slope surfaces Fs1 and Fs2, and at the connecting position, that is, the boundary position between the base end Pb and the slope surfaces Fs3 and Fs4, the change in shape with respect to the axial position change is discontinuous. Therefore, the force to bend the probe Pr tends to concentrate.

However, since the surfaces b1 and b2 of the regions B1 and B2 are continuously connected to the outer peripheral surface pa of the tip end Pa, the discontinuities in the change in shape with respect to the axial position change at the boundary position between the tip end Pa and the slope surfaces Fs1 and Fs2 are reduced. Further, since the surfaces b3 and b4 of the regions B3 and B4 are continuously connected to the outer peripheral surface pb of the base end Pb, the discontinuities in the change in shape with respect to the axial position change at the boundary position between the base end Pb and the slope surface Fs3 are reduced.

As a result, the force applied to the boundary position between the tip end Pa and the slope surface Fs1 and the boundary position between the base end Pb and the slope surface Fs3 is reduced, so that strain is less likely to concentrate at this boundary position.

Further, at the connection position, that is, the boundary position between the slope surface Fs1 and the flat portion Pf, and at the connection position, that is, the boundary position between the slope surface Fs3 and the flat portion Pf, the change in shape due to the axial position change becomes discontinuous, so that the force to bend the probe Pr tends to concentrate.

However, when the regions B1 and B2 are provided across the slope surfaces Fs1 and Fs2 and the flat surface Fw, and the regions B3 and B4 are provided across the slope surfaces Fs3 and Fs4 and the flat surface Fw, the boundary position between the slope surfaces Fs1 and Fs2 and the flat portion Pf, and the boundary position between the slope surfaces Fs3 and Fs4 and the flat portion Pf are reinforced by the bulges of the regions B1 to B4, so that strain is hard to concentrate at the boundary positions.

Further, when the probe Pr is formed by performing press working on a round bar member, the mold is provided with recesses corresponding to the regions B1 to B4, as described later. Then, at the time of press working, the pressure of the press escapes to the recesses of the mold, so that the pressure applied to the regions B1 to B4 is relaxed. As a result, when the probe Pr is pressed, strain of the press working is less likely to concentrate on the first connection region Pc1 and the second connection region Pc2. That is, by providing the probe Pr with the regions B1 to B4, it is possible to reduce the risk of strain concentration during press working.

Figure 14:
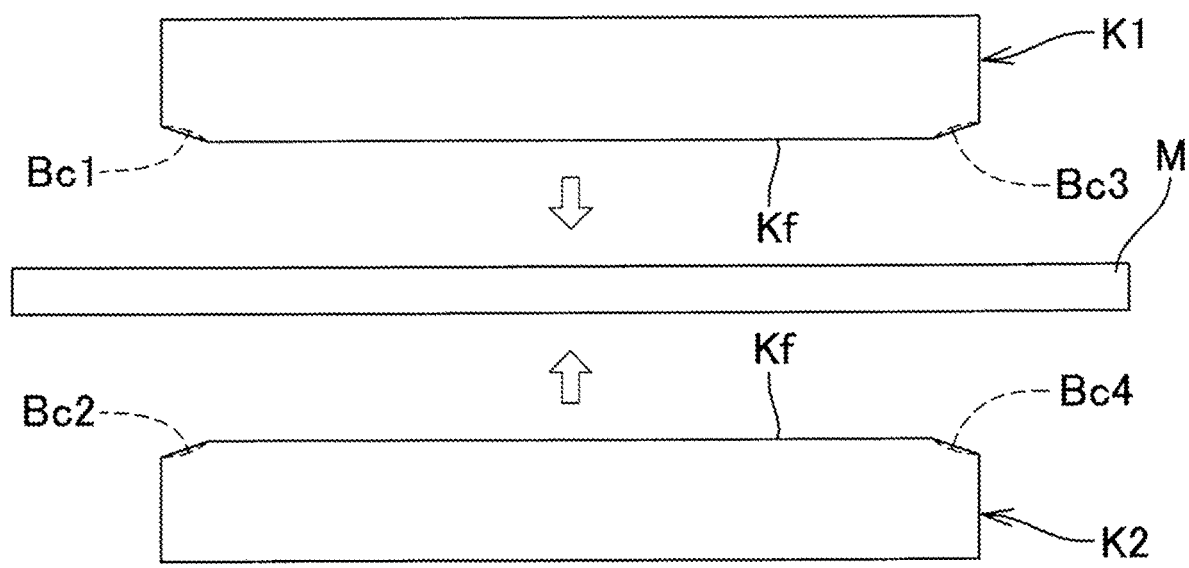
FIG. 14 is an explanatory diagram for explaining an example of a method for manufacturing the probe illustrated in FIG. 2.

FIG. 14 is an explanatory diagram for explaining an example of a method of manufacturing the probe Pr illustrated in FIG. 2. The probe Pr can be manufactured by pinching a round bar-like wire M of a conductive metal material or the like between a pair of a first mold K1 and a second mold K2 with press surfaces Kf projecting in a substantially trapezoidal shape, for example, corresponding to the shape of the body portion PC, for example, and performing press-working thereon.

A press surface Kf is provided with a recess Bc1 corresponding to the region B1, a recess Bc2 corresponding to the region B2, a recess Bc3 corresponding to the region B3, and a recess Bc4 corresponding to the region B4. In this way, when a bar-like wire M is sandwiched between a first mold K1 and a second mold K2 in which the recesses Bc1 to Bc4 are formed and pressed, the pressure of the press escapes to the recesses Bc1 to Bc4, and thus the pressure applied to the regions B1 to B4 is relieved. As a result, at the time of press working, strain due to the press working is less likely to concentrate on the first connection region Pc1 and the second connection region Pc2.

With respect to locations such as the first connection region Pc1 and the second connection region Pc2, where the change in shape with respect to the position is large, the press pressure is likely to concentrate during press working, and strain is likely to concentrate.

However, the first mold K1 and the second mold K2 which correspond to the body portion PC and are formed with the recesses Bc1 to Bc4 are used to perform press working on the bar-like wire M in order to manufacture the probe Pr, and thus, strain is unlikely to concentrate on the first connection region Pc1 and/or the second connection region Pc2.

Figure 15:
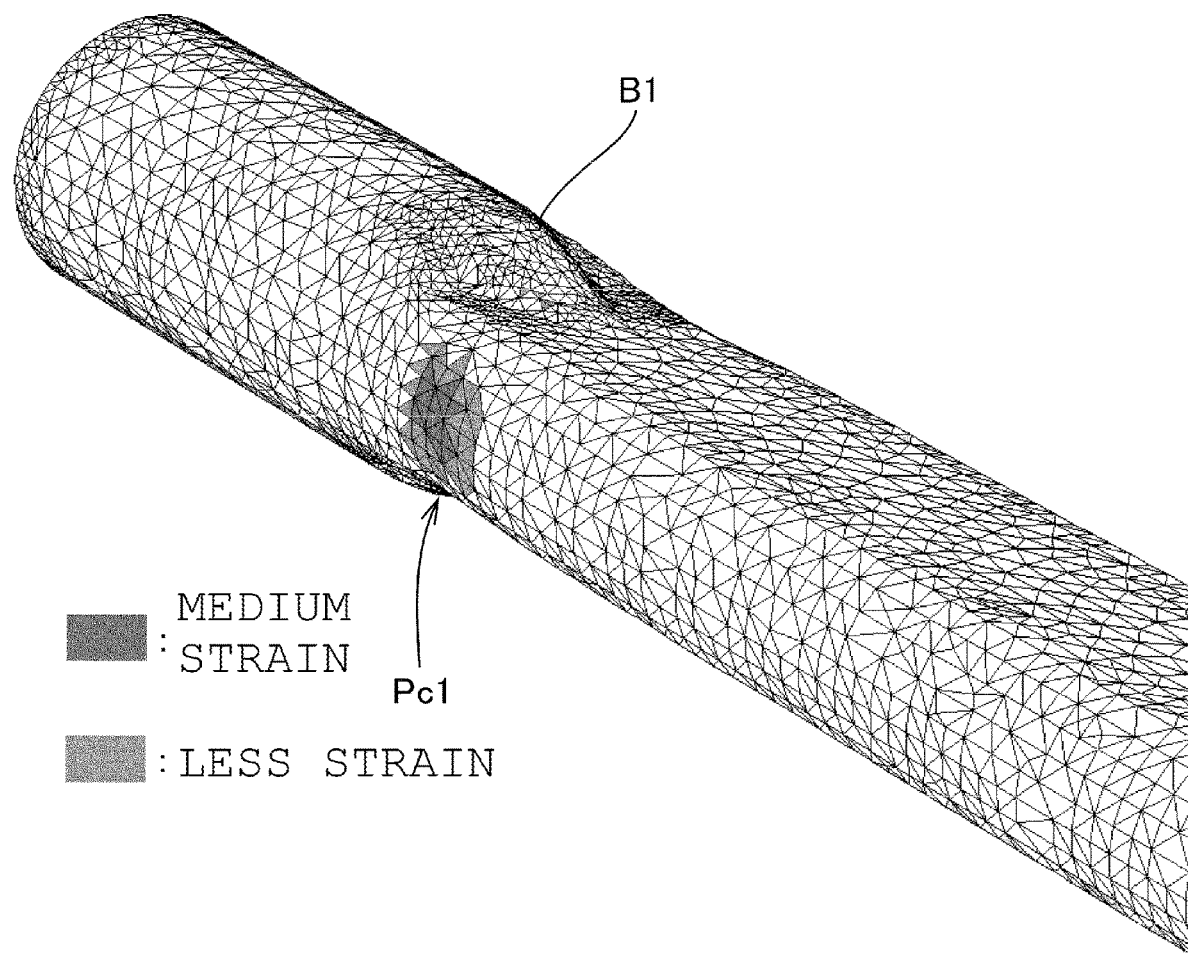
FIG. 15 is an explanatory diagram illustrating a simulation result of strain generated by press working.
Figure 16:
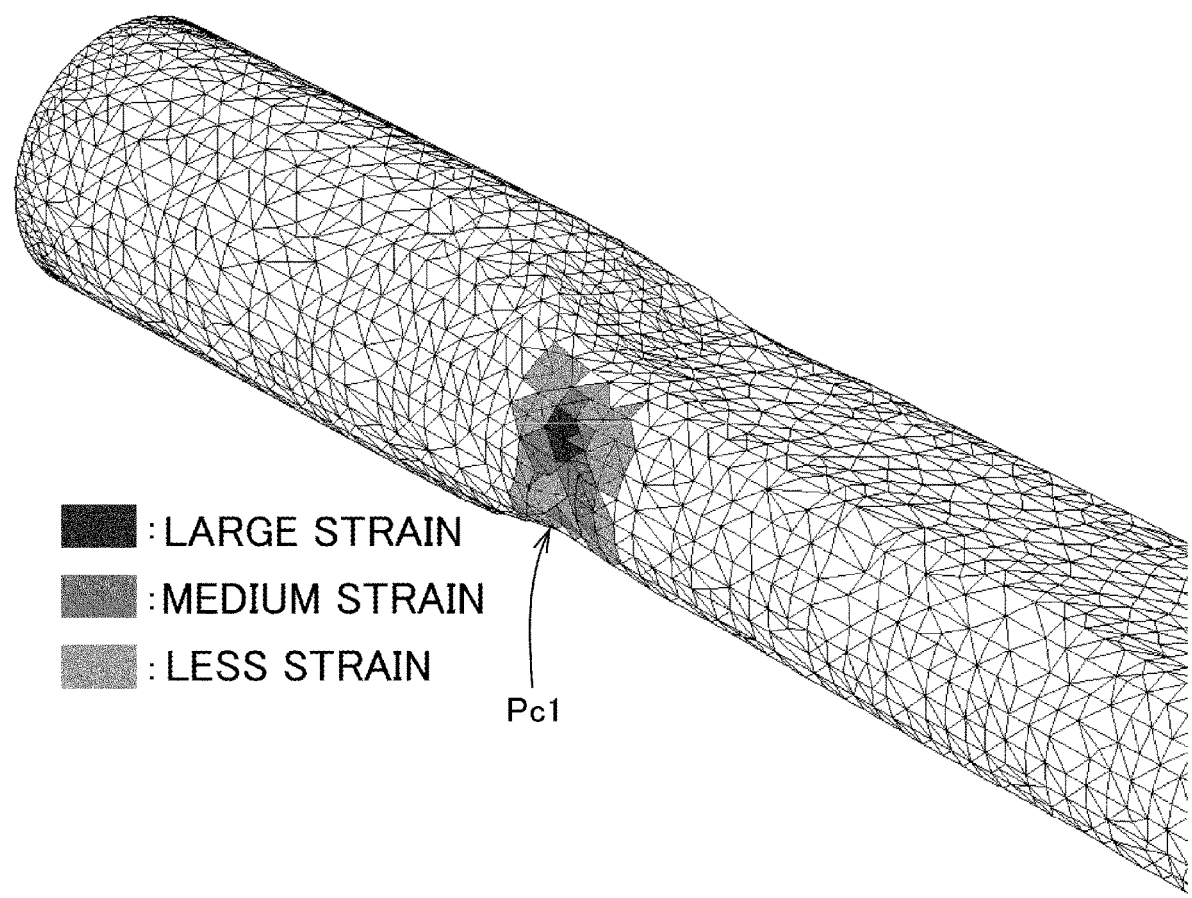
FIG. 16 is an explanatory diagram illustrating a simulation result of a comparative example in which a first region is not provided.

FIG. 15 is an explanatory diagram illustrating a simulation result of strain generated in the vicinity of the first connection region Pc1 by press working. FIG. 16 is an explanatory diagram illustrating a simulation result of a comparative example in which the region B1 is not provided in the first connection region Pc1. In FIGS. 15 and 16, the magnitude of strain is illustrated in three stages according to density. For example, the darkest portion represents "large strain", the next darkest portion "medium strain", and the next darkest portion "less strain".

As illustrated in FIG. 16, in the comparative example in which the region B1 is not provided, the first connection region Pc1 has a portion where "large strain", a portion "medium strain" in its periphery, and a portion "less strain" in the periphery thereof.

On the other hand, as illustrated in FIG. 15, in the case where the region B1 is provided, there is no "large strain" portion. Further, the portions of "medium strain" and "less strain" are narrower than in the case where the region B1 of FIG. 16 is not provided. As described above, it has been confirmed by simulation that the provision of the region B1 reduces strain generated by the press working.

In the manufacturing method illustrated in FIG. 14, the pressing is not limited to the example in which it is performed once, and the probe Pr may be molded by performing pressing a plurality of times while sequentially reducing the interval between the first mold K1 and the second mold K2, for example. In this case, it is possible to reduce the amount of strain of the bar-like wire M in each pressing and thereby to reduce distortion applied to the probe Pr.

Also, shapes of a plurality of probes Pr may be molded by aligning and integrating a plurality of first molds K1 illustrated in FIG. 14, for example, at such intervals that slightly exceed the total length of the tip ends Pa and the base ends Pb in the axial direction of the round bar-like wire M, similarly aligning and integrating a plurality of second molds K2 at such intervals that slightly exceed the total length of the tip ends Pa and the base ends Pb in the axial direction of the round bar-like wire M, and performing press working with the mold in which the plurality of first molds K1 are integrated and with the mold in which the plurality of second molds K2 are integrated. Then, the plurality of probes Pr may be manufactured by cutting the individual probes Pr after such press working.

According to the press working illustrated in FIG. 14, the body portion PC crushed by the first mold K1 and the second mold K2 has a shape that widens in the width direction as in the front view FV illustrated in FIG. 2. The shapes of the body portions PC may be adjusted through cutting or the like of the opposite sides or one side of the body portions PC when seen from the front in the front view FV illustrated in FIG. 2 after such press working.

The inspection processing unit 8 illustrated in FIG. 1 can be configured using, for example, a signal generation circuit, a signal detection circuit, a power source circuit, a voltmeter, an ammeter, a microcomputer, and the like. The inspection processing unit 8 outputs an inspection signal to the inspection points 101 of the semiconductor wafer 100 via the probes Pr and detects a signal occurring in the semiconductor wafer 100 via the probes Pr. Then, a reference signal pattern stored in advance is compared with the detected signal, for example, thereby inspecting the semiconductor wafer 100.

Alternatively, the inspection processing unit 8 supplies a current between two inspection points of a measurement target via the probes Pr and measures a voltage between the two inspection points in a case in which a substrate is an inspection object, for example. A resistance value between the two inspection points is calculated by an Ohm's law based on the supplied current and the measured voltage. The inspection processing unit 8 can execute the inspection of the substrate by detecting the resistance value between the respective inspection points in this manner.

Note that the inspection processing unit 8 can inspect the inspection object by various methods, and the inspection methods are not limited.

That is, the probe according to the present disclosure has a substantially bar shape, and includes one end, the other end, and the body portion which is located between the one end and the other end and has a thickness in the thickness direction orthogonal to the axial direction of the substantially bar shape thinner than the one end. The body portion includes the first slope surface which is continuous with the one end and is inclined with respect to the axial direction in a direction in which the thickness becomes gradually thinner with increasing distance from the one end. The first region having a surface shape that bulges outward is provided in at least a part of the first slope surface.

According to this configuration, the location where the first slope surface of which thickness changes is provided is a location where strain is likely to concentrate when the probe is pressed against the inspection object. Since the first region having a surface shape that bulges outward is provided at the location where strain is likely to concentrate, the location where strain is likely to concentrate is reinforced by the bulge of the first region. As a result, it is possible to make it difficult to concentrate strain.

Further, the body portion further includes the second slope surface on the side opposite to the first slope surface in the thickness direction, and the second region with a surface shape that bulges outward is preferably provided in at least a part of the second slope surface.

According to this configuration, both sides of the probe are reinforced in a balanced manner.

Further, the body portion further includes the third slope surface that is continuous with the other end and is inclined with respect to the axial direction in a direction in which the thickness becomes gradually thinner with increasing distance from the other end. The third region having a surface shape that bulges outward is preferably provided in at least a part of the third slope surface.

According to this configuration, the same reinforcement as that of the first region can be performed by the third region also on the third slope surface provided on the other end side of the probe.

At least one of the first and second regions preferably swells gradually toward the one end.

According to this configuration, the thickness of at least one of the first and second regions changes continuously, so that the risk of strain in the first and second regions is reduced.

Further, it is preferable that the width of at least one of the first and second regions in a width direction orthogonal to the axial direction and the thickness direction becomes gradually narrowed with increasing distance from the one end.

When the width of the first region occupies most of the width of the body portion at the end opposite to the one end of the first region, there is a risk that strain may concentrate on the end of the opposite first region. According to this configuration, the width of the first region becomes gradually narrower as it goes away from the one end, so that the influence of the bulge at the end of the first region on the opposite side to the one end becomes small, and as a result, the risk of strain concentration on the end of the first region on the opposite side to the one end is reduced.

Further, it is preferable that at least one of the first to third regions includes a partial region having a substantially constant distance from the bar-like shaft center with respect to the positional change in the axial direction.

Since the boundary between the one end and the first slope surface is a portion where the shape changes, strain is likely to concentrate. According to this configuration, the portion where strain is likely to concentrate is provided with the partial region having a substantially constant distance from the bar-like shaft center and thus having high strength. As a result, the strength of the portion where strain is likely to concentrate is increased.

Further, it is preferable that at least one of the first to third regions includes a partial region in which the width in the width direction is substantially constant with respect to the position change in the axial direction.

Since the boundary between the one end and the first slope surface is a portion where the shape changes, strain is likely to concentrate. According to this configuration, in the portion where strain is likely to concentrate, at least one of the first to third regions includes a partial region having a substantially constant width, and thus a partial region having high strength is provided. As a result, the strength of the portion where strain is likely to concentrate is increased.

Further, it is preferable that the first region is provided on the first slope surface.

According to this configuration, the strength of the first slope surface is improved.

Further, an inspection jig according to the present disclosure includes a plurality of probes described above and a support member that supports the plurality of probes.

According to this configuration, it is possible to reduce the risk of strain concentration.

In addition, the inspection device according to the present disclosure inspects the inspection object by bring the probe into contact with the inspection object.

According to this configuration, it is possible to provide an inspection device in which strain is less likely to concentrate on the probe.

In addition, in the method for manufacturing the probe according to the present disclosure, a first mold and a second mold that face each other in the thickness direction, correspond to a shape of the body portion, and have recesses corresponding to the first region are used, and press working is performed on a bar-like member that is interposed between the first mold and the second mold.

According to this configuration, it is possible to manufacture a probe in which strain is less likely to concentrate.

The probe, the inspection jig, and the inspection device having such a configuration can make it difficult to concentrate strain. Further, the method for manufacturing such probe can provide a probe in which strain is less likely to concentrate.

This application is based on Japanese Patent Application No. 2018-134857 filed on Jul. 18, 2018, the content of which is included in the present application. It should be noted that the specific embodiments or examples made in the modes for carrying out the present disclosure are merely for clarifying the technical contents of the present disclosure, and the present disclosure is not limited only to such specific examples. It should not be construed in a narrow sense by limiting only.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A probe having a substantially bar shape, comprising:
one end;
another end; and
a body portion that is located between the one end and the other end and has a thickness in a thickness direction orthogonal to an axial direction of the substantially bar shape thinner than the one end,
wherein the body portion includes a first slope surface that is continuous with the one end and is inclined with respect to the axial direction in a direction in which the thickness becomes gradually thinner with increasing distance from the one end, and
wherein a first region having a surface shape that bulges outward is provided in at least a part of the first slope surface and wherein the first slope surface and the first region are provided on one same side of the body portion so that the surface shape bulges outward with respect to the same side of the body portion, and
wherein the one end, the other end, and the body portion are coaxial with the axial direction.

2. The probe according to claim 1,
wherein the body portion further includes a second slope surface on a side opposite to the first slope surface in the thickness direction, and
wherein a second region having a surface shape that bulges outward is provided on at least a part of the second slope surface.

3. The probe according to claim 2,
wherein the body portion further includes a third slope surface that is continuous with the other end and is inclined with respect to the axial direction in a direction in which the thickness becomes gradually thinner with increasing distance from the other end, and
wherein a third region having a surface shape that bulges outward is provided in at least a part of the third slope surface.

4. The probe according to claim 3,
wherein at least one of first to third regions includes a partial region in which a distance from a shaft center of the bar shape is substantially constant with respect to a positional change in the axial direction.

5. The probe according to claim 3,
wherein at least one of first to third regions includes a partial region in which a width in a width direction is substantially constant with respect to a positional change in the axial direction.

6. The probe according to claim 2,
wherein at least one of first and second regions gradually swells toward the one end.

7. The probe according to claim 2,
wherein a width of at least one of first and second regions in a width direction orthogonal to the axial direction and the thickness direction becomes gradually narrower with increasing distance from the one end.

8. The probe according to claim 2,
wherein the body portion further includes a third slope surface that is continuous with the other end and is inclined with respect to the axial direction in a direction in which the thickness becomes gradually thinner with increasing distance from the other end, and
wherein a third region having a surface shape that bulges outward is provided in at least a part of the third slope surface.

9. The probe according to claim 2,
wherein at least one of the first and second regions gradually swells toward the one end.

10. The probe according to claim 2,
wherein a width of at least one of the first and second regions in a width direction orthogonal to the axial direction and the thickness direction becomes gradually narrower with increasing distance from the one end.

11. The probe according to claim 2,
wherein the first region is provided on the first slope surface.

12. An inspection jig, comprising:
a plurality of probes according to claim 2; and
a support member that supports the plurality of probes.

13. An inspection device for inspecting an inspection object,
wherein the probe according to claim 2 is brought into contact with the inspection object.

14. A method of manufacturing the probe according to claim 2, comprising:
using a first mold and a second mold that face each other in the thickness direction, correspond to a shape of the body portion, and have recesses corresponding to the first region; and performing press working on a bar-like member that is interposed between the first mold and the second mold.

15. The probe according to claim 1, wherein the first region is provided on the first slope surface.

16. An inspection jig, comprising:
a plurality of probes according to claim 1; and
a support member that supports the plurality of probes.

17. An inspection device for inspecting an inspection object,
wherein the probe according to claim 1 is brought into contact with the inspection object.

18. A method of manufacturing the probe according to claim 1, comprising:
using a first mold and a second mold that face each other in the thickness direction, correspond to a shape of the body portion, and have recesses corresponding to the first region; and
performing press working on a bar-like member that is interposed between the first mold and the second mold.

* * * * *